United States Patent [19]

Minoura et al.

[11] Patent Number: 4,703,397
[45] Date of Patent: Oct. 27, 1987

[54] FUNCTION CIRCUIT INCORPORATING TYPE WIRING DEVICE FOR AUTOMOBILE

[75] Inventors: Takayoshi Minoura, Kosai; Kikuo Ogawa, Haibara, both of Japan

[73] Assignee: Yazaki Corporation, Japan

[21] Appl. No.: 907,147

[22] Filed: Sep. 12, 1986

[30] Foreign Application Priority Data

Sep. 12, 1985 [JP] Japan .................. 60-200592

[51] Int. Cl.$^4$ .................. H02B 1/04
[52] U.S. Cl. .................. 361/428; 361/420; 361/399
[58] Field of Search .................. 361/428, 399, 420; 339/17 C

[56] References Cited

U.S. PATENT DOCUMENTS

| 3,041,504 | 6/1962 | Lacan | 361/428 |
| 3,936,133 | 2/1976 | Splitt et al. | 361/428 |
| 4,367,513 | 1/1983 | Cronin | 361/428 |

FOREIGN PATENT DOCUMENTS

| 089778 | 9/1983 | European Pat. Off. . |
| 140473 | 5/1985 | European Pat. Off. . |
| 661350 | 11/1951 | United Kingdom . |
| 661349 | 11/1951 | United Kingdom . |
| 661279 | 11/1951 | United Kingdom . |
| 2127625 | 4/1984 | United Kingdom . |

Primary Examiner—Robert S. Macon
Attorney, Agent, or Firm—Lowe, Price, LeBlanc, Becker & Shur

[57] ABSTRACT

In a function circuit incorporating type wiring device for an automobile, including a junction block employed for an electronic wiring in the automobile, and an electronic unit pack detachably connected to the junction block, the electronic unit pack being provided with a case, a printed board incorporated in the case and forming a function circuit for effecting connection of a signal between wire harnesses, a junction block connector formed on an outer periphery of the case and an external connector formed on the outer periphery of the case; the improvement comprises at least one tabular connection terminals led from the junction block into the junction block connector of the electronic unit pack and projected into the external connector of the electronic unit pack to form a through circuit, said tabular connection terminals being connected with a part of the function circuit on the printed board as required.

13 Claims, 15 Drawing Figures

FIG. 1a
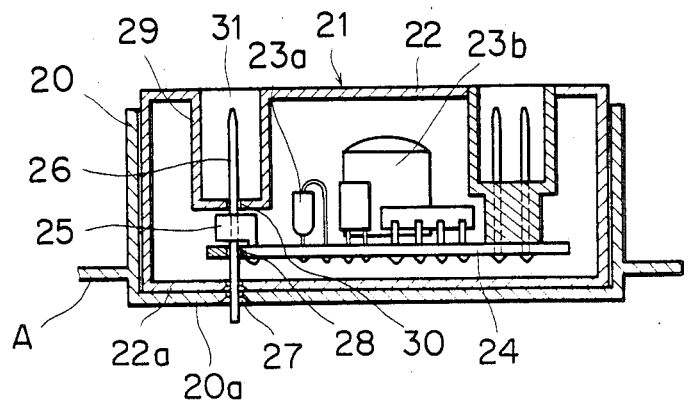
FIG. 1b
FIG. 2b
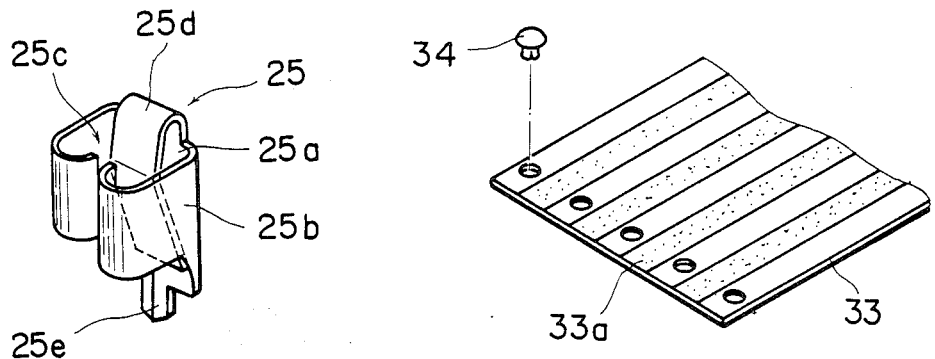
FIG. 2a
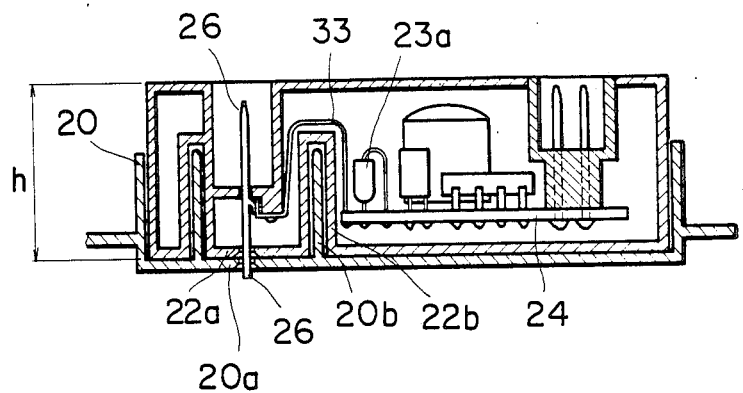

FUNCTION CIRCUIT INCORPORATING TYPE WIRING DEVICE FOR AUTOMOBILE

BACKGROUND OF THE INVENTION

The present invention relates to a function circuit incorporating type wiring device for an automobile, and more particularly to a function circuit incorporating type wiring device for an automobile, including a junction block as a main element and an electronic unit pack as a subelement detachably connected to the junction block, so as to increase current capacity of a through circuit formed on a printed board and make the electronic unit pack compact.

Conventionally, an electric wiring for an automobile employs a junction block connectively incorporating a plurality of wiring boards and terminals (connectors) thereof, which wiring boards are provided with many relays, fuses and bus bar circuits on an insulating substrate, for the purpose of simplifying production of a wire harness and mode of the wiring. For example, it has been proposed that a plurality of junction blocks are arranged at suitable positions in a compartment to control various loads (electrical parts) by a main wiring having less branched lines and a branched wiring (Japanese Patent Publication No. 57-34132).

However, the electrical parts to be installed in the automobile have been recently increased because safety of the automobile is pursued and requirement of improvement in comfortability. As a result, the wire harness is made large and complicated, and the junction block itself is also made complicated in structure because of addition of the relay and fuse, etc. To decrease the number of electrical wires in the wire harness and simplify the internal structure of the junction block, there has been develped a system wherein a function circuit is incorporated in the junction block so as to process a part of operation by an input signal to the junction block and generate an output after processed. As a typical example of the system, there has been proposed a function circuit incorporating type wiring device including a connector for directly transmitting input and output signals to a function circuit section not through the junction block, for the purpose of decreasing the number of the bus bar in the junction block.

However, even in the case of using of the junction block that incorporates the function circuit therein, if any electrical parts are added, or a specification is partially changed, it is necessary to change the internal or external structure of the junction block. Accordingly, there has been recently proposed another system wherein an electronic unit pack acting as a sub-junction block is detachably connected to a main junction block (optionally, plural junction blocks), so that the pack may be exchanged to quickly meet the requirements.

Such an electronic unit pack connected to the junction block as mentioned above naturally includes a through circuit that is used in the pack and is led to the outside from a viewpoint of connective function.

FIGS. 6a and 6b show an exemplary electronic unit pack to be connected to the junction block in the prior art. Referring to FIGS. 6a and 6b, reference numerals 1, 2 and 3 designates a junction block, an electronic unit pack and a connector connected to an end of a wire harness W, respectively. A junction block connector 5 and an external connector 6 are provided on an outer periphery of a case 4 of the pack 2.

As shown in FIG. 6b, a circuit led from the junction block 1 through the connector 5 to the pack 2 is comprised of a signal circuit 8 led into an electronic unit 7 only, an output circuit 9 led out from the unit 7, and through circuits 10a and 10b. The through circuits are comprised of a circuit 10a led into the electronic unit 7 and branched out therefrom and a circuit 10b passing through the pack 2 as it stands. The through circuits 10a and 10b and the output circuit 9 are electrically connected with connector terminals (not shown) in the external connector 6. The electronic unit 7 forms a function circuit by requisite electronic devices such as resistor, capacitor, transistor, IC, LSI and relay, electronic parts and a printed board which will be hereinafter described.

FIGS. 7a and 7b show an internal structure of the pack 2 in FIG. 6a. In an example shown in FIG. 7a, the junction block connector 5 and the external connector 6 are fixed to separate printed boards 11a and 11b in the case 4, respectively. Both the connectors 5 and 6 are arranged reversely to each other, and the printed boards 11a and 11b are electrically connected with each other by jumping wires 12 or the like. In another example shown in FIG. 7b, the connector 5 is directly fixed to a printed board 11c, and the connector 6 is fixed to the case 4 or the printed board 11c. A connection terminal 13 of the connector 6 is formed in a U-shape to absorb a level difference h between the connector 6 and the printed board 11c.

Referring back to FIG. 6a, a case 14 of the junction block 1 incorporates a bus bar wiring board (not shown) having a desired circuit arrangement and a function circuit. Further, the junction block 1 includes a pack connector 15, external connectors 16, fuse 17, fuse holder 18 and relay 19.

In the conventional function circuit incorporating type wiring device constituted of the junction block 1 and the pack 2, as the through circuits 10a and 10b are necessarily formed on the printed boards 11a to 11c, permissible current cannot be made large. Further, as the junction block connector 5 and the external connector 6 are directly fixed onto the printed board, a fixed mounting space is required to cause a decrease in a mounting space for the electronic unit, rendering the pack 2 relatively large-scale as a whole.

SUMMARY OF THE INVENTION

Accordingly, it is an object of the present invention to provide a function circuit incorporating type wiring device for an automobile, including a junction block and an electronic unit pack detachably connected to the junction block, which device may increase permissible current in a through circuit formed in the pack and simultaneously make the pack itself compact.

According to a first aspect of the present invention, in a function circuit incorporating type wiring device for an automobile, including a junction block employed for an electronic wiring in the automobile, and an electronic unit pack detachably connected to the junction block, the electronic unit pack being provided with a case, a printed board incorporated in the case and forming a function circuit for effecting connection of a signal between wire harnesses, a junction block connector formed on an outer periphery of the case and an external connector formed on the outer periphery of the case; the improvement comprises at least one tabular connection terminals led from the junction block into the junction block connector of the electronic unit pack and projected into the external connector of the electronic unit pack to form a through circuit, said tabular connection terminals being connected with a part of the function circuit on the printed board as required.

According to a second aspect of the present invention, in a function circuit incorporating type wiring device for an automobile, including a junction block employed for an electronic wiring in the automobile, and an electronic unit pack detachably connected to the junction block, the electronic unit pack being provided with a case, a printed board incorporated in the case and forming a function circuit for effecting connection of a signal between wire harnesses, a junction block connector formed on an outer periphery of the case and an external connector formed on the outer periphery of the case; the improvement comprises at least one junction terminals fixed to the printed board and formed with a male terminal portion at one end and with a female terminal portion at the other end, said male terminal portion being projected into the external connector of the electronic unit pack, and a tabular connection terminal led from the junction block into the junction block connector of the electronic unit pack and inserted into the female terminal portion of the junction terminal to form a through circuit by the combination of the junction terminal and the tabular connection terminal, said junction terminal being connected with a part of the function circuit on the printed board as required.

According to the first aspect of the present invention, the tabular connection terminal connected to the junction block is substituted for a through circuit passing through the junction block to the external connector without entering the function circuit in the electronic unit pack. Further, in the case that the through circuit is incorporated as an input signal circuit into the electronic unit in the pack, it may be connected with the function circuit in the pack by a suitable means.

Accordingly, the following effects may be obtained.
(1) Magnitude of permissible current in the through circuit (the tabular connection terminal) may be freely set.
(2) It is possible to eliminate a through circuit (as usually formed by a bold pattern) merely passing through the printed board in the pack.
(3) Therefore, a free space is created on the printed board to enable an additional electronic unit to be provided and also enable the printed board to be made compact.
(4) The number of parts may be decreased by the substitution of the junction block connection terminal for the through circuit.
(5) Generally, it is possible to increase a degree of freedom of designing of the function circuit inclusive of the through circuit in the printed board in the pack, thereby rendering the designing of the function circuit easy.

According to the second aspect of the present invention, since the through circuit is formed by the junction block connection terminal and the junction terminal fixed to the printed board, handling of the through circuit in the pack may be made easy in addition to the aforementioned effects (1) to (5) of the first aspect of the present invention. For example, the through circuit is hardly restricted in structure such as a mounting position of the junction block connector and the external connector.

Other objects and features of the invention will be more fully understood from the following detailed description and appended claims when taken with the accompaning drawings.

BRIEF DESCRIPTION OF THE DRAWINGS

FIG. 1a is a sectional view of the essential part of a first preferred embodiment in the first aspect of the present invention;

FIG. 1b is a perspective view of a female terminal used in FIG. 1a;

FIG. 2a is a sectional view of the essential part of a second preferred embodiment;

FIG. 2b is a perspective view of a flexible printed board used in FIG. 2a;

FIG. 2c is an enlarged sectional view of the essential part in FIG. 2a;

FIG. 3b is a perspective view of a junction terminal used in FIG. 3a;

FIG. 4b is a perspective view of a junction terminal used in FIG. 4a;

FIG. 6b is an internal circuit diagram of the electronic unit pack used in FIG. 6a;

FIG. 7a is a sectional side view showing an internal structure of the pack used in FIG. 6a; and FIG. 7b is a sectional side view showing another internal structure of the pack used in FIG. 6a.

DETAILED DESCRIPTION OF THE PREFERRED EMBODIMENTS

Figure 3A:
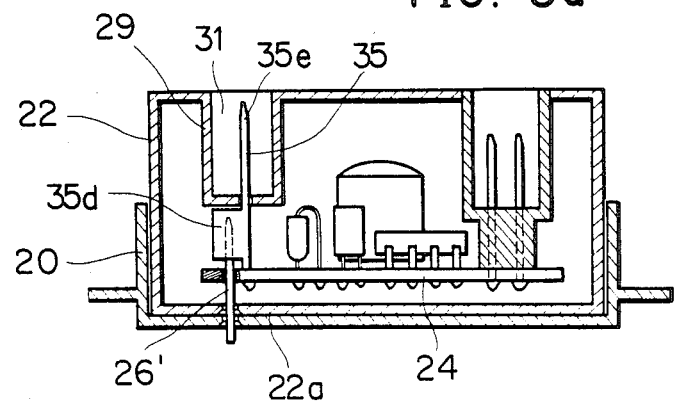
FIG. 3a is a sectional view of the essential part of a third preferred embodiment in the second aspect of the present invention.

FIGS. 1a to 2b show the first aspect of the present invention. Referring now to FIG. 1a, there are shown a junction block A, a receiving box 20, and an electronic unit pack 21. A case 22 of the pack 21 receives electronic devices 23a and 23b such as resistor and capacitor, and a printed board 24 constituting a function circuit. Reference numeral 25 designates a female terminal soldered to the printed board 24. As shown in FIG. 1b, the female terminal 25 includes a base 25a and vertical side walls 25b formed on both sides of the base 25a. The vertical side walls 25b are bent back at their free ends toward the base 25a to form bent portions. Thus, a receiving space 25c for receiving a tabular connection terminal 26 is defined between the bent portions and the base 25a. Further, an elastic contact portion 25d is extended from one end of the base 25a into the receiving space 25c, and a connection pin 25e is projected from the other end of the base 25a. The connection pin 25e is electrically connected with a part of the function circuit of the printed board 24. The tabular connection terminal 26 for connecting the junction block A with the pack 21 is inserted through through-holes 27 of respective engagement surfaces 20a and 22a of the receiving box 20 and the case 22, and is further inserted through a recess or through-hole 28 of the printed board 24 into the receiving space 25c of the female terminal 25. The connection terminal 26 is electrically connected with the elastic contact portion 25d of the female terminal 25. An upper end of the connection terminal 26 passes through a through-hole 30 formed at a bottom wall of a housing 29 integrally formed with the case 22, and projects into the housing 29.

Figure 6A:
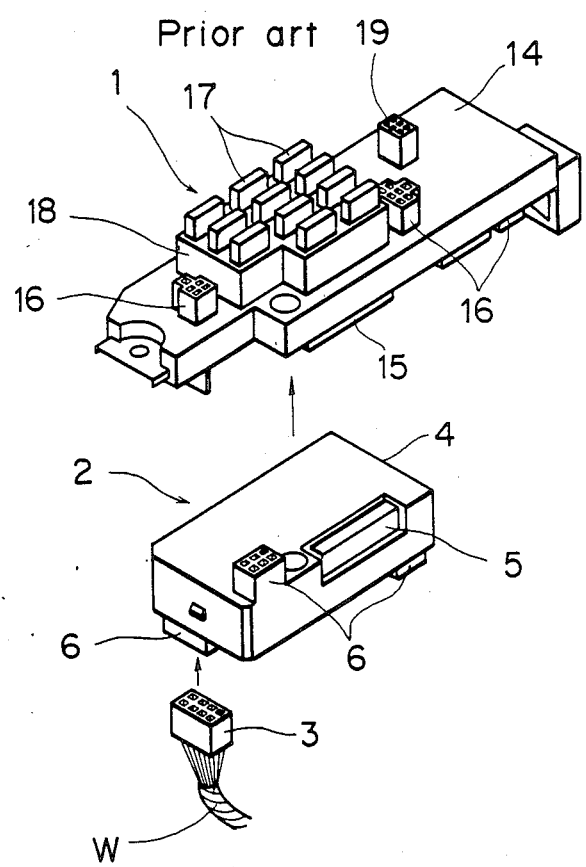
FIG. 6a is an exploded perspective view of the wiring device in the prior art.
Figure 6B:
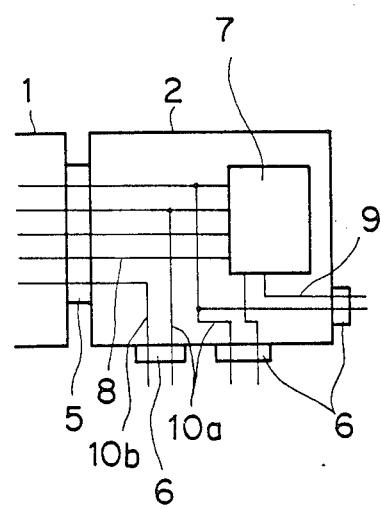

The housing 29 is arranged on a side opposite to the engagement surface 22a of the case 22, and an external connector 31 (corresponding to the external connector 6 as shown in FIGS. 6a and 6b) is formed by the housing 29 and the connection terminal 26. The engagement surfaces 20a, and 22a correspond to the pack connector 15 and the junction block connector 5 as shown in FIGS. 6a and 6b.

Figure 2C:
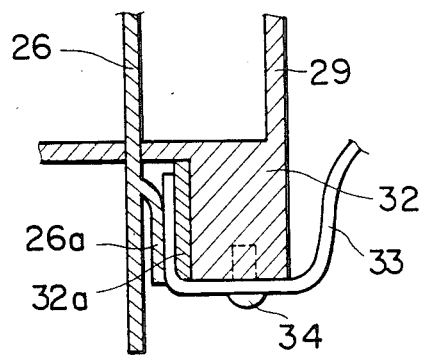

Referring to FIGS. 2a to 2c, the engagement surfaces 20a and 22a of the receiving box 20 and the case 22 are formed with a projecting wall 20b and a mating engagement recess 22b so as to partition on the connection terminal 26 from the printed board 24. As shown in FIG. 2b, the bottom wall of the housing 29 is formed with a projecting receiving seat 23, and a flexible printed board (FPC) 33 is connected with the printed board 24 at one end thereof, while being fixed at the other end to the receiving seat 32 by means of pins 34. The FPC 33 is sandwiched between an inside surface of the receiving seat 32 and the connection terminal 26 to provide electrical connection of conductive patterns 33a with the connection terminal 26. As shown in FIG. 2c, for the purpose of ensuring a contact pressure between the connection terminal 26 and the conductive patterns 33a, the connection terminal 26 is preferably formed with a contact portion 26a as cut away therefrom in such a manner as to extend obliquely downwardly, and an elastic member 32a such as rubber is preferably attached to the inside surface of the receiving seat 32. In this embodiment shown in FIGS. 2a to 2c, as the female terminal 25 in FIGS. 1a and 1b is not provided, the height h of the case 22 may be reduced by the size of the female terminal 25.

As is described above, the through circuit is formed by the connection terminal 26 itself directly projected through the junction block A into the housing 29 of the pack 21. In the case that a signal circuit is led from the connection terminal 26 into the pack, the connection terminal 26 is connected through the female terminal 25 or the FPC 33 to the function circuit of the printed board 24. Further any of the connection terminals 26 employed for the purpose of connection only with the pack 21 may be formed in a short length as usual. The terminals projecting into the housing 29 may include any terminal as an output circuit led out from the printed board 24 other than the connection terminal 26 as the through circuit.

FIGS. 3a to 5b show the second aspect of the present invention. Referring to FIGS. 3a and 3b, reference numeral 35 designates a junction terminal including a base 35a and vertical side walls 35b formed on both sides of the base 35a. The vertical side walls 35b are bent back at their free ends toward the base 35a to form elastic holding arms 35c. Thus, a female terminal portion 35d for receiving a tabular connection terminal 26' is defined between the arms 35c and the base 35a. Fruther, a male terminal portion 35e is upwardly extended from one end of the base 35a, and a connection pin 35f is projected from the other end of the base 35a.

The connection pin 35f of the junction terminal 35 is fixed to the printed borad 24 by soldering, and the male terminal portion 35e is projected into the housing 29. On the other hand, the tabular connection terminal 26' extending from the junction block A is inserted through the through-holes 27 and 28 into the female terminal portion 35d, thus forming a through circuit of the pack 21 by the connection terminal 26' and the junction terminal 35.

In this embodiment, since the through-hole 30 of the housing 29 is not required to be aligned to the connection terminal 26' as different from the previous embodiments shown in FIGS. 1a to 2b, designing in a structure such as a mounting position of the housing 29 may be made easy.

Figure 4A:
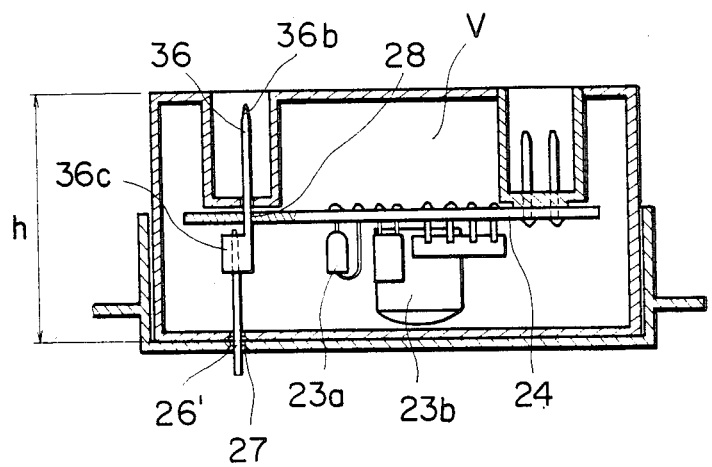
FIG. 4a is a sectional view of the essential part of a fourth preferred embodiment.
Figure 4B:
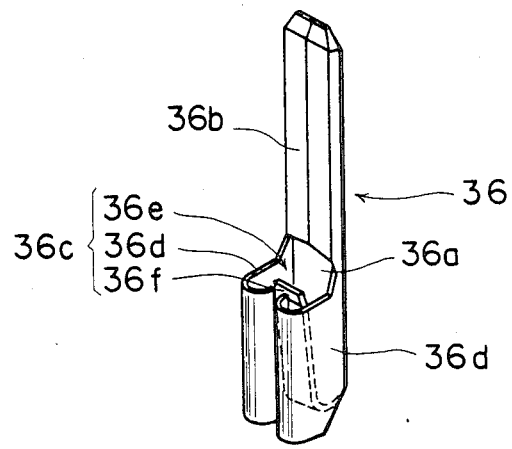

Referring to FIGS. 4a and 4b, a junction terminal 36 has a structure similar to that of the junction terminal 35 on such a point where a male terminal portion 36b is formed at one end, and a female terminal portion 36c is formed at the other end, with the exception that the male terminal portion 36b is formed by inwardly folding both sides of the base 36a, and the female terminal portion 36c is constituted of bent portions bent back from vertical side walls 36d to the base 36a, a receiving space 36e defined by the base 36a and the bent portions for receiving the tabular connection terminal 26', and an elastic contact portion 36f extending from the other end of the base 36a into the receiving space 36e.

As shown in FIG. 4a, the junction terminal 36 is soldered at a base position of the male terminal portion 36b to the through-hole 28 of the printed board 24, thereby arranging the male terminal portion 36b above the printed board 24, while arranging the female terminal portion 36c below the printed board 24.

Figure 3B:
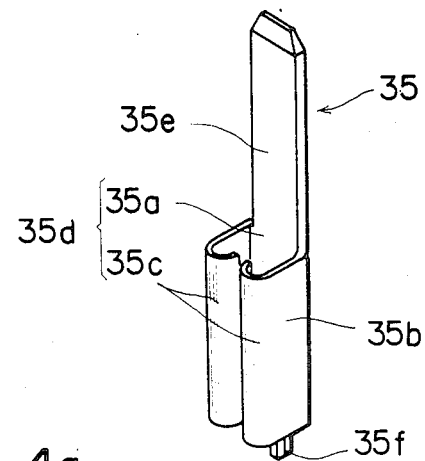

In this embodiment, the height h of the case 22 may be reduced by the size of the female terminal portion 36c as compared with the previous embodiment shown in FIGS. 3a and 3b. Furthermore, as the electronic devices 23a and 23b are located on a lower side of the printed board 24, a space V defined above the printed board 24 may be utilized for installation of any other electronic devices or printed boards.

Figure 5A:
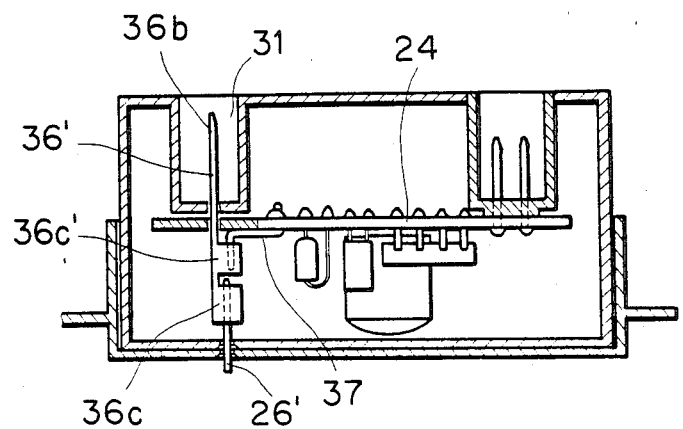
FIG. 5a is a sectional view of the essential part of a fifth preferred embodiment.
Figure 5B:
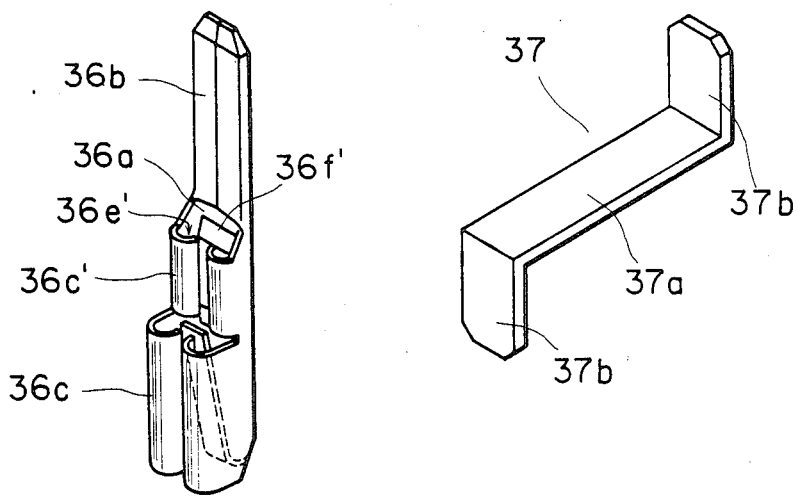
FIG. 5b is a perspective view of a junction terminal and a female terminal for the printed board.
Figure 7A:
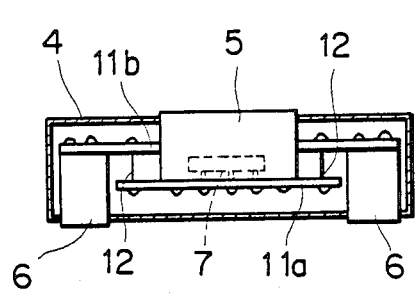
Figure 7B:
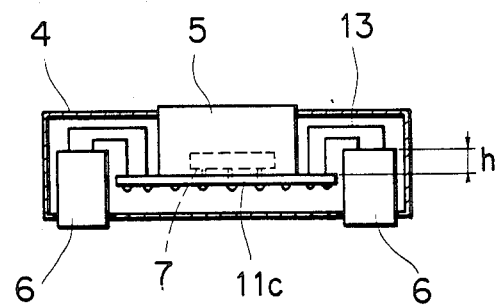

Referring to FIGS. 5a and 5b, a junction terminal 36' has a structure similar to that of the junction terminal 36 as shown in FIGS. 4a and 4b, with the exception that a second female terminal portion 36c' having a length smaller than that of a first female terminal portion 36c is formed between a male terminal portion 36b and the first female terminal portion 36c. The second female terminal portion 36c' includes an elastic contact portion 36f' formed by partially cutting the base 36a and projecting the same into a receiving space 36e'. Reference numeral 37 designates a crank-shaped female terminal for the printed board 24 for connecting the junction terminal 36' with the printed board 24. The female terminal 37 is formed with reversely extending contact portions 37b bent in an L-shape at both ends of a plate-like conductive member 37a. One of the contact portions 37b is soldered to the printed board 24, and the other is inserted into the second female terminal portion 36c'.

In this embodiment, the junction terminal 36' and the printed board 24 may be connected irrespective of the distance therebetween by appropriately selecting the length of the plate-like conductive member 37a of the female terminal 37. Accordingly, it is possible to increase a degree of freedom of designing in a structure such as a mounting position of the housing 29.

In the aforementioned embodiments as shown in FIGS. 1a to 5b, the junction block A may incorporate fundamental function circuits used in common irrespective of a kind and grade of the automobile, such as a usual power supply, oscillation circuit, timer circuit, key illumination timer, seat belt alarm, half-closed door alarm and lamp cut alarm. On the other hand, the electronic unit pack 21 may incorporate function circuits depending on a kind and grade of the automobile discretely or in combination, such as a wiper control unit, room lamp control unit and defogger control unit.

In this case, not only variation of the kind and grade, but also addition of electrical parts or modification of a specification may be quickly followed by exchanging the pack 21 to be mounted to the junction block A without any change in structure of the junction block itself.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. In a function circuit incorporating type wiring device for an automobile, including a junction block employed for an electric wiring in the automobile, and an electronic unit pack detachably connected to said junction block, said electronic unit pack being provided with a case, a printed board incorporated in said case and forming a function circuit for effecting connection of a signal between wire harnesses, a junction block connector formed on an outer periphery of said case, and an external connector formed on the outer periphery of said case; the improvement comprising at least one tabular connection terminal led from said junction block into said junction block connector of said electronic unit pack and projected into said external connector of said electronic unit pack to form a through circuit, said tabular connection terminals being connected with a part of said function circuit on said printed board as required.

2. The function circuit incorporating type wiring device as defined in claim 1, further comprising a female terminal member electrically connected to said printed board by soldering.

3. The function circuit incorporating type wiring device as defined in claim 2, wherein said female terminal member comprises a base, a pair of vertical side walls formed on both sides of said base and bent back toward said base at its free ends, a receiving space defined between said base and said side walls for receiving said tabular connection terminal to provide electrical connection with said tabular connection terminal, an elastic contact portion extending from one end of said base into said receiving space, and a connection pin extending from the other end of said base and adapted to be connected to said printed board.

4. The function circuit incorporating type wiring device as defined in claim 1, further comprising a flexible printed board electrically connected to said printed board at one end and also electrically connected to said tabular connection terminal at the other end.

5. The function circuit incorporating type wiring device as defined in claim 4, further comprising a pin for fixing said flexible printed board to a projected portion of a housing for receiving said external connector.

6. The function circuit incorporating type wiring device as defined in claim 5, wherein said tabular connection terminal is formed with a resilient contact portion to be electrically connected with said flexible printed board.

7. The function circuit incorporating type wiring device as defined in claim 6, further comprising an elastic member attached to said projected portion of said housing for securing contact between said resilient contact portion and said flexible printed board.

8. In a function circuit incorporating type wiring device for an automobile, including a junction block employed for an electric wiring in the automobile, and an electronic unit pack detachably connected to said junction block, said electronic unit pack being provided with a case, a printed board incorporated in said case and forming a function circuit for effecting connection of a signal between wire harnesses, a junction block connector formed on an outer periphery of said case, and an external connector formed on the outer periphery of said case; the improvement comprising at least one junction terminals fixed to said printed board and formed with a male terminal portion at one end and with a female terminal portion at the other end, said male terminal portion being projected into said external connector of said electronic unit pack, and a tabular connection terminal led from said junction block into said junction block connector of said electronic unit pack and inserted into said female terminal portion of said junction terminal to form a through circuit by the combination of said junction terminal and said tabular connection terminal, said junction terminal being connected with a part of said function circuit on said printed board as required.

9. The function circuit incorporating type wiring device as defined in claim 8, wherein said junction terminal comprises a base, a pair of vertical side walls formed on both sides of said base, a pair of elastic holding arms bent back from said side walls toward said base, a female terminal portion formed between said arms and said base for receiving said tabular connection terminal to provide electrical connection with said tabular connection terminal, a male terminal portion extending from one end of said base and adapted to be connected with said external connector, and a connection pin projecting from the other end of said base and adapted to be connected to said printed board.

10. The function circuit incorporating type wiring device as defined in claim 8, wherein said junction terminal comprises a base, a pair of vertical side walls formed on both sides of said base, a male terminal portion extending from one end of said base and folded inwardly at both sides thereof, and a female terminal portion comprising a pair of bent portions bent back from said side walls toward said base, a receiving space defined between said base and said bent portions for receiving said tabular connection terminal to provide electrical connection with said terminal, and an elastic contact portion extending from the other end of said base into said receiving space.

11. The function circuit incorporating type wiring device as defined in claim 10, wherein said male terminal portion is soldered at its base to said printed board.

12. The function circuit incorporating type wiring device as defined in claim 10, further comprising a second female terminal portion having a length smaller than that of said female terminal portion, said second female terminal portion comprising a pair of second bent portions bent back from said side walls toward said base, a second receiving space defined between said base and said second bent portions, and a second elastic contact portion projected from said base by partially cutting said base.

13. The function circuit incroporating type wiring device as defined in claim 12, further comprising a crank-shaped conductive member connected with said printed board at one end, and inserted into said second receiving space of said second female terminal portion at the other end.

* * * * *